United States Patent
Kouchiyama

Patent Number: 6,101,071
Date of Patent: Aug. 8, 2000

[54] MR FILM WITH UPPER AND LOWER MAGNETIC LAYERS WITH RESISTIVITY GREATER THAN THAT OF MR FILM MAGNETIC LAYERS

[75] Inventor: Akira Kouchiyama, Kanagawa, Japan

[73] Assignee: Sony Corporation, Tokyo, Japan

[21] Appl. No.: 08/905,400

[22] Filed: Aug. 4, 1997

[30] Foreign Application Priority Data

Aug. 7, 1996 [JP] Japan .................................. 8-208315

[51] Int. Cl.[7] .................................................. G11B 5/127
[52] U.S. Cl. ......................... 360/324; 338/32 R; 324/252
[58] Field of Search .................................... 360/113, 324; 338/32 R; 324/252, 207.21

[56] References Cited

U.S. PATENT DOCUMENTS

| | | | |
|---|---|---|---|
| 5,247,413 | 9/1993 | Shibata et al. | 360/113 |
| 5,304,975 | 4/1994 | Saito et al. | 338/32 R |
| 5,313,186 | 5/1994 | Schuhl et al. | 338/32 R |
| 5,341,261 | 8/1994 | Dieny et al. | 360/113 |
| 5,422,571 | 6/1995 | Gurney et al. | 324/252 |
| 5,442,508 | 8/1995 | Smith | 360/113 |
| 5,447,781 | 9/1995 | Kano et al. | 360/113 |
| 5,738,946 | 4/1998 | Iwasaki et al. | 428/611 |
| 5,795,663 | 8/1998 | Koike et al. | 360/113 |
| 5,872,502 | 2/1999 | Fujikata et al. | 338/32 R |
| 5,874,888 | 2/1999 | Araki et al. | 338/32 R |

*Primary Examiner*—Brian E. Miller
*Attorney, Agent, or Firm*—Hill & Simpson

[57] ABSTRACT

A multi-layered magnetoresistance effect film, a magnetoresistance effect device and a magnetoresistance effect magnetic head of high sensitivity not affected by the sense current magnetic field. The multi-layered magnetoresistance effect film 1 includes a multi-layered film 4 of a pattern made up of magnetic layers 10 and non-magnetic electrically conductive layers 11, repeatedly layered together, and electrically conductive layers 3, 5 formed on at least one end face in the layering direction of the multi-layered film 4. The resistivity of the electrically conductive layers 3, 5 is selected to be larger than that of the magnetic layer 10. The magnetoresistance effect device has the above-defined multi-layered magnetoresistance effect film 1, while the magnetoresistance effect magnetic head has the above-defined magnetoresistance effect device.

6 Claims, 6 Drawing Sheets

MR FILM WITH UPPER AND LOWER MAGNETIC LAYERS WITH RESISTIVITY GREATER THAN THAT OF MR FILM MAGNETIC LAYERS

BACKGROUND OF THE INVENTION

1. Field of the Invention

This invention relates to a multi-layered magneto-resistance effect film having repeatedly layered magnetic and non-magnetic layers and which exhibits a giant magneto-resistance effect. This invention also relates to a magneto-resistance effect device employing this multi-layered magneto-resistance effect film and to a magneto-resistance effect magnetic head employing this magneto-resistance effect device.

2. Description of the Related Art

The magneto-resistance effect device is a device used for detecting a magnetic field and usually includes a substantially rectangular magneto-resistance effect film and a pair of electrodes mounted on both longitudinal ends of the magneto-resistance effect film. The magneto-resistance effect film is a thin film the resistance value of which is changed with the magnitude of the external magnetic field. For detecting the external magnetic field using the magneto-resistance effect device, a constant sense current is usually supplied via a pair of electrodes to the magneto-resistance effect film for detecting changes in voltage of the sense current. Specifically, with the magneto-resistance effect device, the magneto-resistance effect film is changed in resistance with changes in the external magnetic field, this change in resistance being detected as changes in voltage of the sense current.

This magneto-resistance effect device is used in, for example, a playback magnetic head. The playback magnetic head employing the magneto-resistance effect device is termed a magneto-resistance effect magnetic head and detects the signal magnetic field from a recording medium as resistance changes of the magneto-resistance effect device.

As such magneto-resistance effect device, such device employing an NiFe alloy film (so-called permalloy film) exhibiting the anisotropic magneto-resistance effect as a magneto-resistance effect film has been extensively used. However, the magneto-resistance effect device employing the permalloy film is low in magneto-resistance change rate and hence a magneto-resistance effect device exhibiting higher magneto-resistance change rate has been desired.

In particular, the magneto-resistance change rate of the magneto-resistance effect device employing the permalloy film is as low as approximately 2% or less under conditions in which the device is used in a magnetic head. Thus, with the tendency to increased density in magnetic recording, a magneto-resistance effect device exhibiting stronger magneto-resistance effect has strongly been desired as a magneto-resistance effect device used for a magneto-resistance effect magnetic head.

It has recently been reported that an extremely high magneto-resistance effect, or so-called giant magneto-resistance effect, can be achieved with a multi-layered film of an artificial lattice film structure made up of layers each being of a thickness of plural atoms of different sorts of metals or the like layered together. Specifically, in M. N. Baibich et al, "Phys. Rev. Lett. 61, p.2472 (1988), it is reported that a multi-layered film of an artificial film structure made up of magnetic layers of Fe and non-magnetic layers of Cr layered together exhibits the giant magneto-resistance effect. Also, in S. S. P. Parkin et all. "Phys. Rev. Lett. 66, p2152 (1991), it is reported that a giant magneto-resistance effect can be achieved with a multi-layered film of an artificial lattice film structure made up of magnetic layers of Co and non-magnetic layers of Cu layered together.

It is felt that the reason the giant magneto-resistance effect can be realized with the multi-layered film of the artificial lattice structure is that Rudermann-Kittel-Kasuya-Yoshida (RKKY) interaction operates between the magnetic layers via conduction electrons in the non-magnetic layers and the opposing magnetic layers are anti-ferromagnetically coupled together to produce anti-parallel spin state to give rise to spin-dependent scattering.

Since the magneto-resistance effect film made up of plural layers of the artificial lattice film structure, referred to herein as a multi-layered magneto-resistance effect film, exhibits a magneto-resistance effect far stronger than the magneto-resistance effect exhibited by the permalloy film, the application thereof to magneto-resistance effect devices or to magneto-resistance effect magnetic heads is thought to be promising.

The multi-layered magneto-resistance effect film has, however, a drawback that, while it has a large rate of change of resistance values, it needs a significant change in magnetic field for realization of a change in resistance. That is, the multi-layered magneto-resistance effect film is insufficient in sensitivity such that it cannot be used in a device in need of detecting a low magnetic field intensity such as a magnetic head. Thus, for using the multi-layered magneto-resistance effect film in a device in need of detecting a low magnetic field intensity, such as a magnetic head, it becomes necessary to render it possible to achieve a large change in resistance even for a small change in magnetic field.

Figure 1:
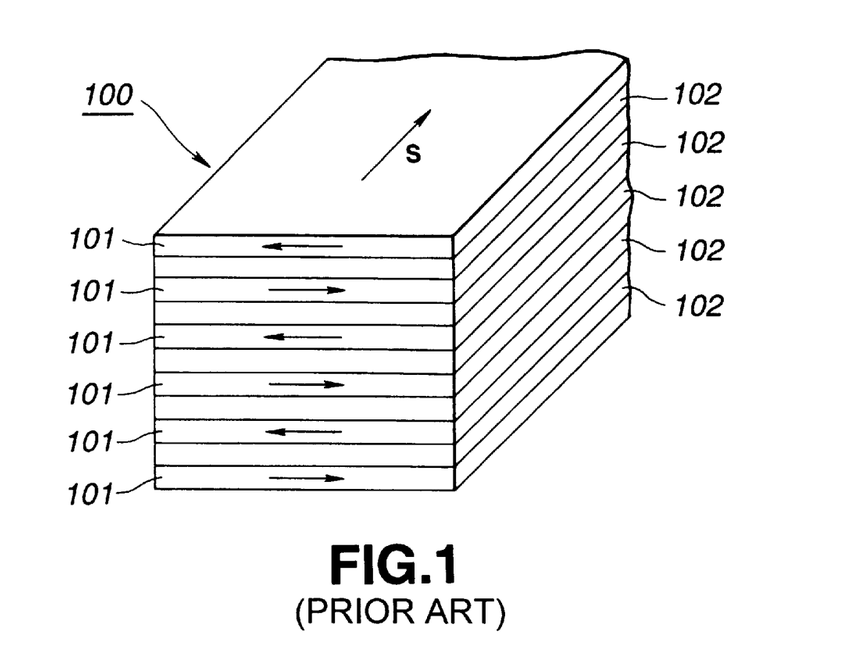
FIG. 1 is a schematic perspective view showing a conventional multi-layered magneto-resistance effect film.

Referring to FIG. 1, such multi-layered magneto-resistance effect film 100 is substantially rectangular in shape and is of a pattern made up of magnetic layers 101 of a magnetic material exhibiting soft magnetic properties and non-magnetic electrically conductive layers 102 layered together repeatedly. With the multi-layered magneto-resistance effect film 100, the magnetic layers 101, layered to one another with interposition of the non-magnetic electrically conductive layers 102, are magnetized so that the respective directions of magnetization run anti-parallel to one another, that is, the magnetic layers 101 are layered in parallel with alternate magnetic layers 101 exhibiting opposite directions of magnetization.

For detecting the external magnetic field in such multi-layered magneto-resistance effect film 100, the sense current is supplied along its length as indicated by arrow S in FIG. 1. With the multi-layered magneto-resistance effect film 100, the resistance value relative to the sense current becomes maximum if the direction of magnetization of the neighboring magnetic layers 101 is anti-parallel to one another, as stated above. If the external magnetic field is impressed across the multi-layered magneto-resistance effect film 100 with the directions of magnetization of the neighboring magnetic layers being parallel to each other, the resistance value to the sense current becomes minimum.

The magneto-resistance effect device, employing the above-described multi-layered magneto-resistance effect film 100 as a magnetically sensitive portion, is used for a magneto-resistance effect magnetic head for detecting the signal magnetic field emanating from the magnetic recording medium. This magneto-resistance effect magnetic head detects changes in resistance with respect to the sense current by the signal magnetic field as changes in voltage for reproducing the signal magnetic field.

If the sense current of large current value is supplied to the above-described multi-layered magneto-resistance effect film 100, there is generated a sense current magnetic field of a magnitude proportionate to the current value. This sense current magnetic field is an annular magnetic field substantially centered at the center of current density distribution, that is an annular magnetic field indicated by arrow T in FIG. 2.

Figure 2:
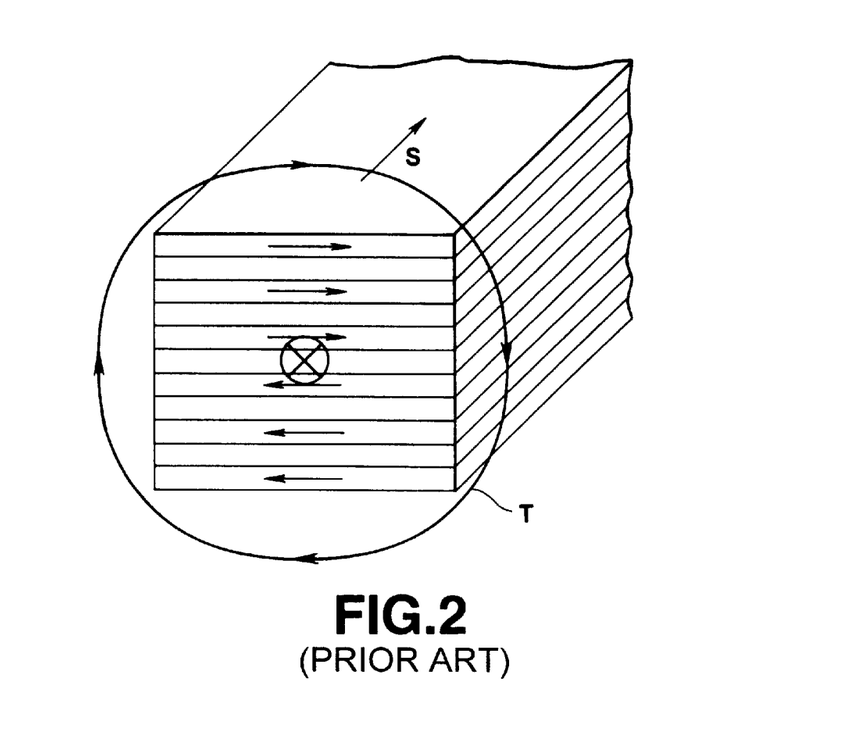
FIG. 2 is a schematic perspective view showing the state in which the sense current is supplied to the conventional multi-layered magneto-resistance effect film.

In the multi-layered magneto-resistance effect film 100, the direction of magnetization of the magnetic layers 101, layered with the non-magnetic electrically conductive layers in-between, is changed with this sense current magnetic field, as shown in FIG. 2. That is, the sense current magnetic field destructs the weak anti-ferromagnetic coupling formed between neighboring are aligned in one direction in which these magnetic layers 101 become anti-parallel to one another with substantially the center along the film thickness of the magnetic layer 101 as a boundary.

Thus, with the multi-layered magneto-resistance effect film 100, the direction of magnetization of the magnetic layers 101 becomes anti-parallel only near the center in the direction along the film thickness thereof while becoming substantially parallel in the remaining portions. The result is that, with the multi-layered magneto-resistance effect film 100, spin-dependent scattering occurs only in the vicinity of the center along the film thickness, while no magneto-resistance effect is displayed in the remaining portions. Thus, with the multi-layered magneto-resistance effect film 100, the amount of change in resistance value with respect to the external magnetic field becomes smaller since the large sense current is supplied to generate a large sense current magnetic field. That is, the multi-layered magneto-resistance effect film 100 has a drawback that, even if the sense current is increased for improving the detection sensitivity of the magneto-resistance effect, the detection sensitivity cannot be improved as desired.

Moreover, if the magneto-resistance effect device employing the multi-layered magneto-resistance effect film 100 is used as the magneto-resistance effect type magnetic head, detection sensitivity to the external magnetic field is deteriorated by the sense current magnetic field, as described above. The result is that this magneto-resistance effect type magnetic head is deteriorated in reproduction sensitivity in reproducing the signal magnetic field of the magnetic recording medium.

SUMMARY OF THE INVENTION

It is therefore an object of the present invention to provide a multi-layered magneto-resistance effect film of high sensitivity not affected by the sense current magnetic field.

It is another object of the present invention to provide a magneto-resistance effect device which, by using this multi-layered magneto-resistance effect film, can detect an external magnetic field of low intensity to high sensitivity.

It is yet another object of the present invention to provide a magneto-resistance effect type magnetic head which, by using such magneto-resistance effect device, can reproduce the signal magnetic field of the magnetic recording medium to high reproduction sensitivity.

In one aspect, the present invention provides a multi-layered magneto-resistance effect film including upper and lower magnetic layers and with a multi-layered film therebetween and having magnetic layers and non-magnetic electrically conductive layers layered repetitively, with an electrically conductive layer formed on at least one end face of the multi-layered film in the layering direction thereof. The electrically conductive layer has resistivity larger than that of the magnetic layer.

In another aspect, the present invention provides a magneto-resistance effect device including a multi-layered magneto-resistance effect film made up of a multi-layered film having magnetic layers and non-magnetic electrically conductive layers layered repetitively and an electrically conductive layer formed on at least one end face of the multi-layered film in the layering direction thereof and a pair of electrodes arranged on both ends of the multi-layered magneto-resistance effect film. The sense current is supplied to the multi-layered magneto-resistance effect film from the paired electrodes.

In yet another aspect, the present invention provides a magneto-resistance effect type magnetic head including a multi-layered magneto-resistance effect film made up of a multi-layered film having magnetic layers and non-magnetic electrically conductive layers layered repetitively and an electrically conductive layer formed on at least one end face of the multi-layered film in the layering direction thereof, and a pair of electrodes arranged on both ends of the multi-layered magneto-resistance effect film. The signal magnetic field emanating from a magnetic recording medium is detected by the magneto-resistance effect device.

With the multi-layered magnetoresistance effect film, magnetoresistance effect device and magnetoresistance effect magnetic head according to the present invention, an electrically conductive layer is formed on at least one end face in the direction of film thickness of the multi-layered film. This gives current density distribution of the sense current supplied to the multi-layered magneto-resistance effect film in which the sense current is concentrated in the multi-layered film. That is, the sense current is supplied only to the multi-layered film exhibiting the magneto-resistance effect, while it can scarcely be supplied to the electrically conductive layer not participating in magneto-resistance effect characteristics. Therefore, it is unnecessary with this multi-layered magnetoresistance effect film to set the amount of the sense current to more than a necessary value. The result is that there is generated no large current density magnetic field in this multi-layered magneto-resistance effect film and hence the magneto-resistance effect is not deteriorated by the sense current magnetic field so that the multi-layered magneto-resistance effect film has extremely high sensitivity.

With the multi-layered magnetoresistance effect film, magnetoresistance effect device and magneto-resistance effect magnetic head according to the present invention, the sense current is concentratedly supplied to near the center of the multi-layered film, so that the multi-layered film is improved in sense current density. Therefore, with the multi-layered magnetoresistance effect film, no large sense current magnetic field is generated over a wide range, so that the direction of magnetization of the magnetic layer making up the multi-layered film can be maintained unchanged by the sense current magnetic field. The result is that, with the multi-layered magnetoresistance effect film, magnetoresistance effect device and magnetoresistance effect magnetic head according to the present invention, the magneto-resistance effect characteristics are not deteriorated during detection of the external magnetic field thus assuring a large amount of resistance change and optimum sensitivity to the external magnetic field.

DESCRIPTION OF THE PREFERRED EMBODIMENTS

Referring to the drawings, preferred embodiments of a multi-layered magneto-resistance effect film, a magneto-resistance effect device and a magneto-resistance effect type magnetic head according to the present invention will b explained in detail.

First, a preferred embodiment of the multi-layered magneto-resistance effect film according to the present invention will be explained in detail.

The multi-layered magneto-resistance effect film of the present embodiment exhibits the giant magneto-resistance effect and is formed by a sputtering method. For sputtering, the degree of vacuum reached was set to $1 \times 10^{-4}$ Pa or less, while the Ar gas pressure was set to 0.1 to 0.5 Pa.

Figure 3:
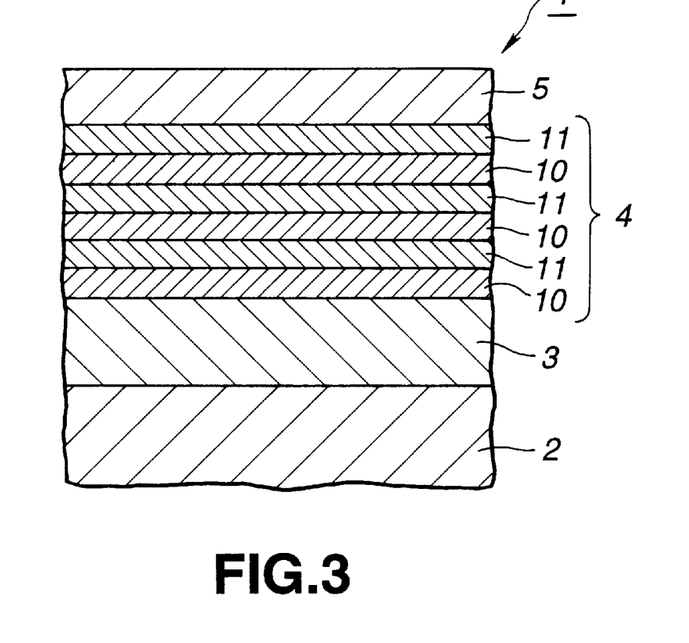
FIG. 3 is a schematic cross-sectional view showing a multi-layered magneto-resistance effect film according to the present invention.

Referring to FIG. 3, this multi-layered magneto-resistance effect film 1 is made up of a substrate 2, a lower magnetic layer 3 formed thereon, a multi-layered film 4 layered on the lower magnetic layer 3 and an upper magnetic layer 5 formed on the multi-layered film 4. The multi-layered layer 4 is made up of three repeatedly layered structures each made up of a non-magnetic electrically conductive layer 10 and a magnetic layer 11 layered together.

The lower magnetic layer 3 is a thin magnetic film formed of a ferromagnetic material and is a Ni—Fe thin film having a film thickness of approximately 7 nm. The upper magnetic layer 5 is a thin magnetic film formed of a ferromagnetic material and is a Ni—Fe thin film having a film thickness of approximately 7 nm. These magnetic layers 3 and 5 are designed so as to have a resistivity larger than the resistivity of the magnetic layer 11.

The non-magnetic electrically conductive layer 10 is formed of a non-magnetic electrically conductive material and is formed as a thin Cu film having a film thickness of approximately 2.1 nm. The magnetic layer 11 is a thin magnetic film of a magnetic material and is a NI—Fe thin film having a film thickness of approximately 2 nm. The magnetic layers making up the multi-layered film 4 are anti-ferromagnetically coupled to one another and have the directions of magnetization which are alternately opposite to one another in the absence of the external magnetic field.

Meanwhile, the magnetic layers 11 making up the multi-layered film 4 are not limited to the above-mentioned Ni—Fe films. Thus, for example, a layered film structure having an Ni thin film and an Fe thin film, layered together, a layered film structure having an Ni alloy thin film and an Fe alloy thin film, a layered film structure having an Ni—Fe based alloy thin film and an Ni—Fe based alloy thin film, layered together, or a layered film structure having an Ni—Fe based alloy thin film and another Ni—Fe based alloy thin film having a different composition, layered together, are also preferably used. The material of the non-magnetic electrically conductive layer 10 making up the multi-layered film 4 is not limited to Cu but may also be selected from at least one of a wide variety of materials, such as Cu, Ag, Au or Cu alloys, Ag alloys or Au alloys.

The multi-layered magneto-resistance effect film 1 according to the present invention exhibits the so-called magneto-resistance effect in which the film is changed in resistance value against the external magnetic field. In the absence of the external magnetic field, the directions of magnetization of the neighboring magnetic layers of the multi-layered magneto-resistance effect film 1 become anti-parallel, at which time the multi-layered magneto-resistance effect film 1 exhibits the maximum resistance value. Conversely, should there exist the external magnetic field, the directions of magnetization of the neighboring magnetic layers of the multi-layered magneto-resistance effect film 1 are changed so as to be parallel to the external magnetic field, at which time the film 1 is lowered in resistance value. The multi-layered magneto-resistance effect film 1 exhibits the minimum resistance value when the directions of magnetization of the neighboring magnetic layers of the multi-layered magneto-resistance effect film 1 become completely parallel to one another.

Figure 4:
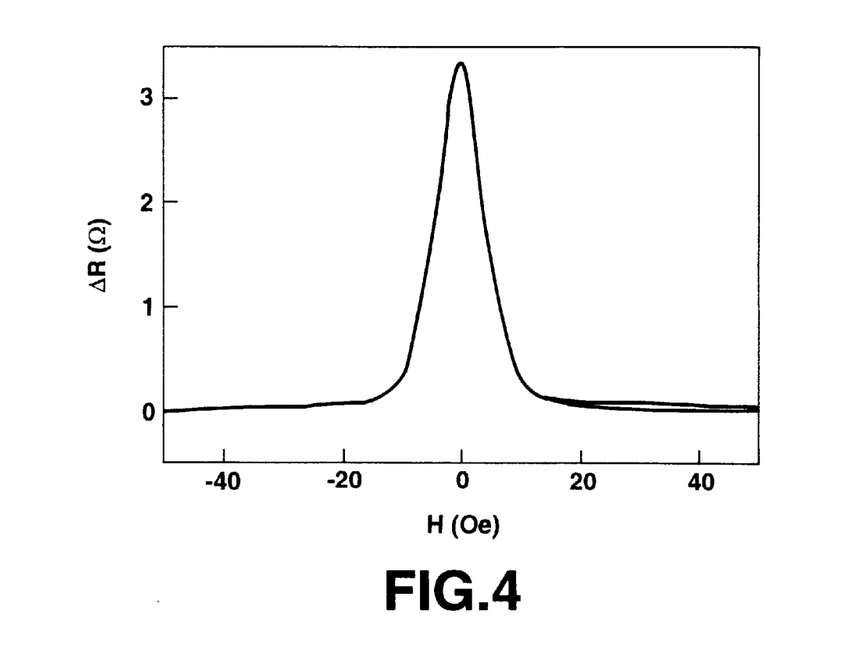
FIG. 4 is a graph showing the magneto-resistance effect of a multi-layered magneto-resistance effect film according to the present invention.
Figure 5:
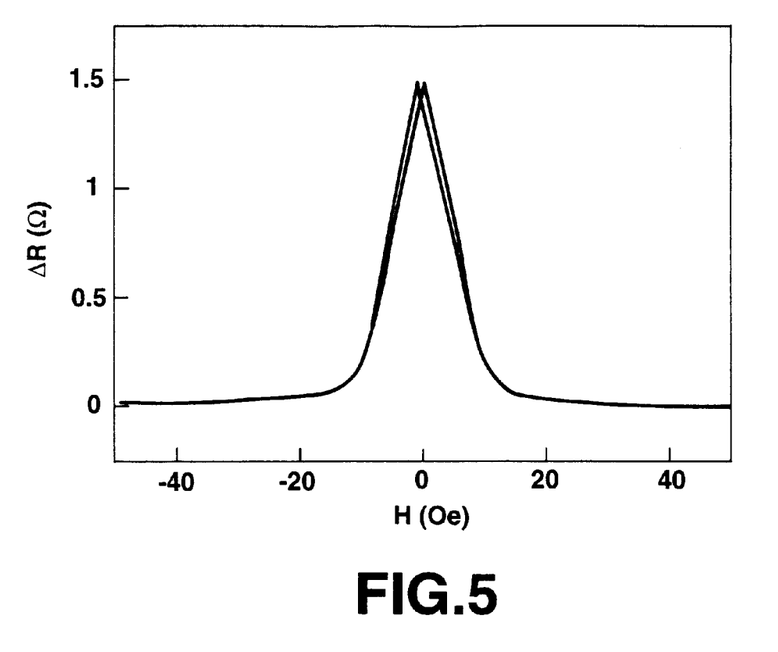
FIG. 5 is a graph showing the magneto-resistance effect of a conventional multi-layered magneto-resistance effect film given by way of comparison.

The magneto-resistance effect of the above-described multi-layered magneto-resistance effect film 1 is shown as a magneto-resistance effect curve in FIG. 4, in which the magnitude of the external magnetic field is plotted on the abscissa and changes in resistance value of the multi-layered magneto-resistance effect film 1 are plotted on the ordinate. For comparison sake, a magneto-resistance effect curve of such a multi-layered magneto-resistance effect film 1 in which the resistivity of the lower magnetic layer 3 and the upper magnetic layer 4 is substantially equal to that of the magnetic layer 11 is shown in FIG. 5. As may be seen from FIGS. 4 and 5, the changes in resistance value of the multi-layered magneto-resistance effect film 1 provided with the lower magnetic layer 3 and the upper magnetic layer 5 higher in resistivity than the magnetic layer 11 are about two or more times as large as those of the multi-layered magneto-resistance effect film 1 not provided with the lower magnetic layer 3 and the upper magnetic layer 5.

If the resistivity of the lower magnetic layer 3 and the upper magnetic layer 5 is substantially equal to that of the magnetic layer 11, the sense current is supplied to these layers 3 and 5. Thus, in such case, the sense current supplied to the multi-layered film 4 exhibiting the magneto-resistance effect is only low in current density. Since the sense current for detecting the magneto-resistance effect is small in the multi-layered magneto-resistance effect film 1, the film 1 is lowered in sensitivity.

If, for eliminating this inconvenience, the current amount of the sense current is increased, there is simultaneously produced a large sense current magnetic field. This large sense current magnetic field destroys the weak anti-ferromagnetic coupling between the magnetic layers 11 to cause changes in the directions of magnetization of the magnetic layers 11. Thus, in such case, changes in resistance value of the multi-layered magneto-resistance effect film 1 are small because spin-dependent scattering can scarcely be produced.

Conversely, with the multi-layered magneto-resistance effect film 1, since the resistivity of the lower magnetic layer 3 and the upper magnetic layer 5 is selected to be larger than that of the magnetic layer 11, the sense current is supplied predominantly to the multi-layered film 4 of the multi-layered magneto-resistance effect film 1. Thus, there is no risk of the large sense current being produced over a wide area to destruct the weak anti-ferromagnetic coupling between the magnetic layers 11. Thus, with the present multi-layered magneto-resistance effect film 1, spin-dependent scattering is generated under an optimum condition, such that the film 1 exhibits large changes in resistance at all times.

Figure 6:
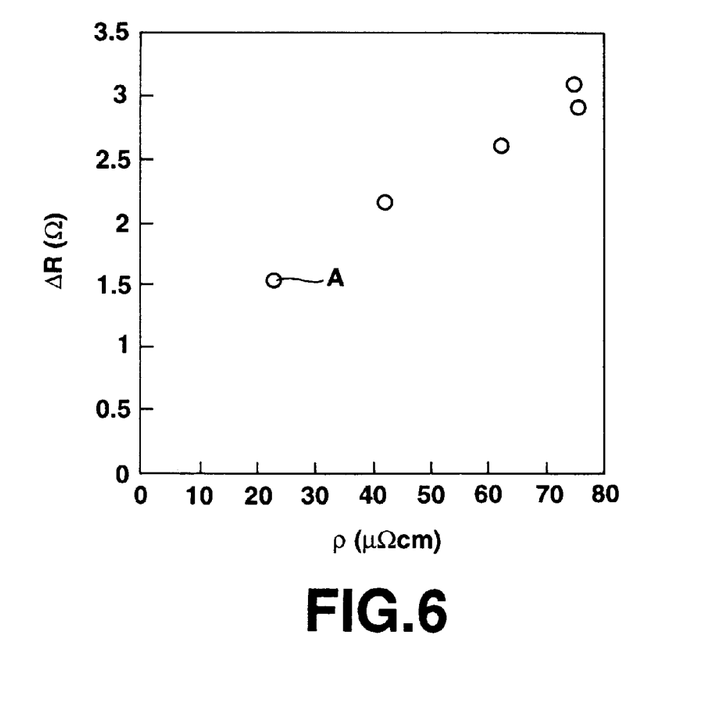
FIG. 6 is a graph showing the relation between the resistivity of the lower and upper magnetic layers and the resistance change rate of the multi-layered magneto-resistance effect film.

Also, with the multi-layered magneto-resistance effect film 1, the resistivity and changes in resistance value of the lower magnetic layer 3 and the upper magnetic layer 5 are substantially proportionate to each other, as shown in FIG. 6. With the multi-layered magneto-resistance effect film 1, the larger the resistivity of the lower magnetic layer 3 and the upper magnetic layer 5, the smaller becomes the effect by the sense current magnetic field and hence the larger becomes the change in resistance. In FIG. 6, the portion indicated by a point A denotes the change in resistance of the conventional multi-layered magneto-resistance effect film in which the resistivity of the lower magnetic layer 3 and the upper magnetic layer 5 is approximately equal to that of the magnetic layer of the multi-layered film.

In the above-described multi-layered magneto-resistance effect film 1, the lower magnetic layer 3 and the upper magnetic layer 5 may be of an Ni—Fe alloy composed of Ni—Fe containing at least one selected from Ti, Cr and Cu. By having at least one selected from Ti, Cr and Cu added to Ni—Fe for the lower magnetic layer 3 and the upper magnetic layer 5, the multi-layered magneto-resistance effect film 1 is increased in resistivity and hence in the amount of change in resistance.

Figure 7:
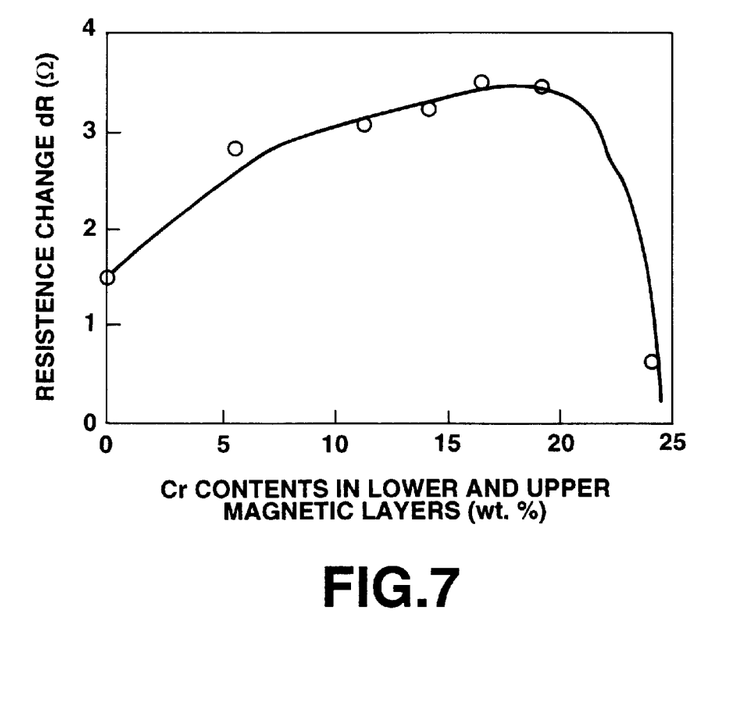
FIG. 7 is a graph showing the relation between the Cr contents in the lower and upper magnetic layers and the amount of resistance change.

The change in resistance of the multi-layered magneto-resistance effect film 1 is changed in dependence upon the Cr content in the lower magnetic layer 3 and the upper magnetic layer 5 composed of Ni—Fe. That is, the lower magnetic layer 3 and the upper magnetic layer 5, containing a pre-set amount of Cr, can be increased in resistivity. The result is that the multi-layered magneto-resistance effect film 1 exhibits large changes in resistance without the weak anti-ferromagnetic coupling between the magnetic layers 11 being destroyed by the sense current magnetic field.

Figure 8:
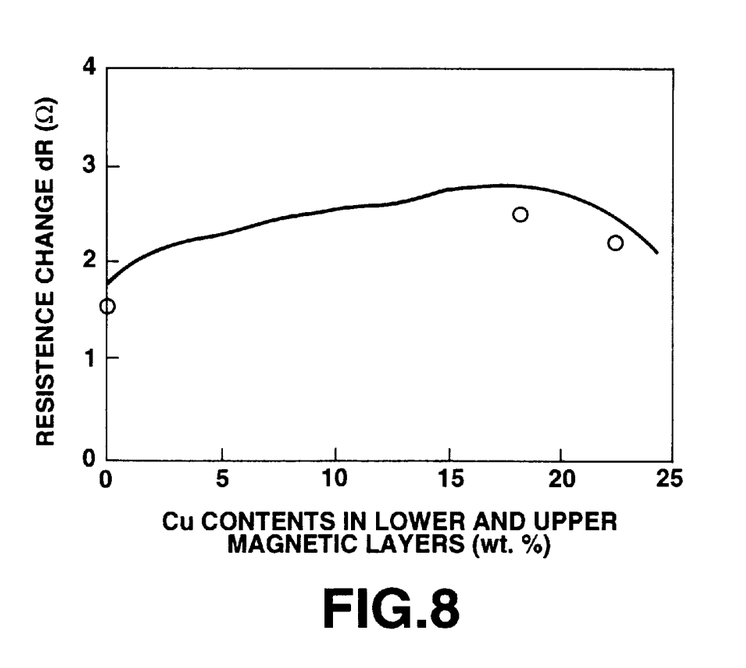
FIG. 8 is a graph showing the relation between the Cu contents in the lower and upper magnetic layers and the amount of resistance change.

FIG. 8 shows the relation between changes in resistance on addition of Cu instead of Cr as described above and the Cu content. In this case, the multi-layered magneto-resistance effect film 1 can be increased in changes in resistance by addition of a pre-set amount of Cu as in the case of adding Cr as described above.

Figure 9:
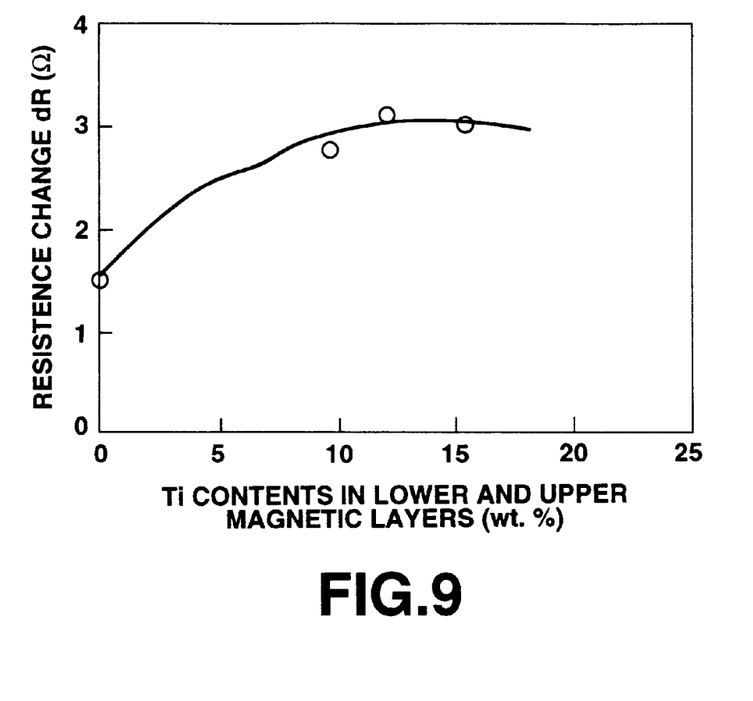
FIG. 9 is a graph showing the relation between the Ti contents in the lower and upper magnetic layers and the amount of resistance change.

Similarly, FIG. 9 shows the relation between changes n resistance and the content of Ti. In this case, the multi-layered magneto-resistance effect film 1 can be increased in changes in resistance by addition of a pre-set amount of Ti as in the case of adding Cr or Cu as described above.

The additives for the lower magnetic layer 3 and the upper magnetic layer 5 may also be substances other than those shown above, such as V or Mn, and may be used alone or in combination.

In the multi-layered magneto-resistance effect film 1, a non-magnetic layer of high resistivity may be used in place of the lower magnetic layer 3. In this case, since the non-magnetic layer of high resistivity is arranged below the multi-layer film 4, there is similarly no risk of destruction of the weak anti-ferromagnetic coupling between the magnetic layers 11. Thus, the multi-layered magneto-resistance effect film 1 exhibits large changes in resistance due to the magneto-resistance effect.

Figure 10:
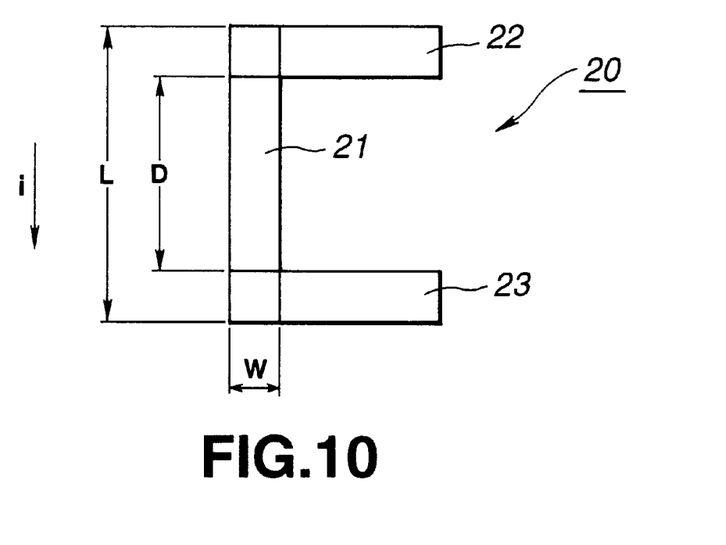
FIG. 10 shows the structure of a magneto-resistance effect device according to the present invention.

Referring to FIG. 10, a magneto-resistance effect device embodying the present invention is now explained.

In FIG. 10, a magneto-resistance effect device 20 of the instant embodiment includes a substantially rectangular multi-layered magneto-resistance effect film 21 and a pair of electrodes 22, 23 attached to both its ends.

The multi-layered magneto-resistance effect film 21 is a multi-layered film exhibiting a giant magneto-resistance effect, in which the resistance value of the film 21 is changed vitally with the magnitude of the external magnetic field. The multi-layered magneto-resistance effect film 21 is the multi-layered magneto-resistance effect film 1 of the previous embodiment processed to substantially rectangular shape. In the present embodiment, the multi-layered magneto-resistance effect film 21 has a width W of approximately 2 $\mu$m and a length L along the long axis of approximately 10 $\mu$m.

The paired electrodes 22, 23 attached to both ends of the multi-layered magneto-resistance effect film 21 are used for supplying the sense current Is to the film 21 for detecting the external magnetic field. In the present embodiment, the distance D between the electrodes 22 and 23, that is, the length D of the portion of the magneto-resistance effect device 20 operating as the magnetically sensitive portion, is set to approximately 8 $\mu$m.

For detecting the external magnetic field by the above-described magneto-resistance effect device 20, the constant sense current Is is supplied to the multi-layered magneto-resistance effect film 21 in parallel with the long-axis direction of the multi-layered magneto-resistance effect film 21 by the paired electrodes 22, 23.

At this time, the multi-layered magneto-resistance effect film 21 of the magneto-resistance effect device 20 exhibits a resistance value corresponding to the magnitude of the external magnetic field. The magneto-resistance effect device 20, supplied with a constant sense current, exhibits changes in resistance value in terms of changes in voltage.

Since the magneto-resistance effect device 20 is formed using the above-mentioned multi-layered magneto-resistance effect film, it exhibits large changes in resistance with respect to the sense current. That is, with the present magneto-resistance effect device 20, there is no risk of the large sense current magnetic field being generated over a wide range, so that there is no risk of the weak anti-ferromagnetic coupling between the magnetic layers 11 being destroyed by the sense current magnetic field. Thus, when detecting the external magnetic field, the magneto-resistance effect device 20 exhibits a large change in resistance with respect to the sense current.

Figure 11:
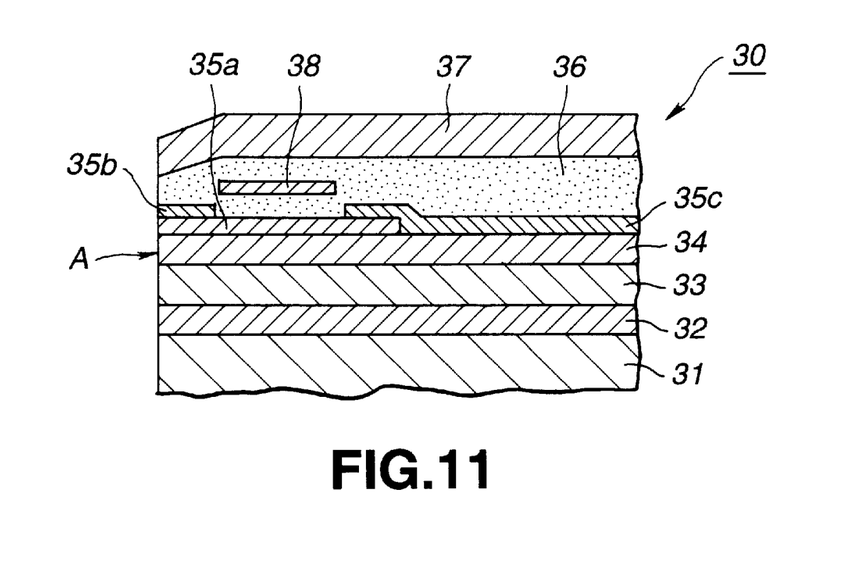
FIG. 11 is a schematic cross-sectional view showing a magneto-resistance effect type magnetic head according to the present invention.

Referring to FIG. 11, a magneto-resistance effect type magnetic head embodying the present invention will now be explained.

The magneto-resistance effect type magnetic head of the instant embodiment is a so-called longitudinal type magneto-resistance effect type magnetic head in which a magneto-resistance effect film is arranged so that its long axis direction is perpendicular to the sliding direction of a recording medium.

Referring to FIG. 11, a magneto-resistance effect type magnetic head 30 of the instant embodiment has a non-magnetic layer 32 formed on a substrate 31 of a non-magnetic material, and includes a lower shield core 33 formed on a non-magnetic layer 32 and a non-magnetic layer 34 formed on the lower shield core 33. The magnetic head 30 also includes a magneto-resistance effect device 35 formed on the non-magnetic layer 34 and a non-magnetic layer 36 formed on the magneto-resistance effect device 35. The magnetic head 30 also includes an upper shield core 37 formed on the non-magnetic layer 36. Also, in the present magneto-resistance effect type magnetic head 30, a bias magnetic field conductor layer 38 is arranged substantially at right angles with the longitudinal direction of the magneto-resistance effect device. The magneto-resistance effect type magnetic head 30 is also coated with a protective layer, not shown, for protecting the head 30 in its entirety.

In the present magneto-resistance effect type magnetic head 30, the lower shield core 33 is used for magnetically shielding the lower portion of the magneto-resistance effect device 35, and is formed of a magnetic material. Similarly, the upper shield core 37 is used for magnetically shielding the upper portion of the magneto-resistance effect device 35, and is formed of a magnetic material. The non-magnetic layer 34, formed between the lower shield core 33 and the magneto-resistance effect device 35, is used for defining the magnetic gap between the lower shield core 33 and the magneto-resistance effect device 35, and is formed of a non-magnetic insulating material. Similarly, the non-magnetic layer 36, formed between the magneto-resistance effect device 35 and the upper shield core 37, is used for defining the magnetic gap between the magneto-resistance effect device 35 and the upper shield core 37, and is formed of a non-magnetic insulating material.

The magneto-resistance effect device 35, formed between the non-magnetic layers 34 and 36, is similar in structure to the magneto-resistance effect device 20 of the previous embodiment, and is made up of a multi-layered magneto-resistance effect film 35a, an electrode 35b derived from the forward end of the multi-layered magneto-resistance effect film 35a and another electrode 35c derived from its rear end.

Similarly to the multi-layered magneto-resistance effect film 21 of the magneto-resistance effect device 20, the multi-layered magneto-resistance effect film 35a is strip-shaped and has its forward end exposed on a surface A of the magneto-resistance effect type magnetic head 30 on which slides the magnetic recording medium.

For forming the multi-layered magneto-resistance effect film 35a, the film 35a is deposited on the non-magnetic layer 34 for facing the surface A, and then the film 35a is patterned to a pre-set strip shape using the known photolithographic technique. This patterning is carried out through the process steps of coating of a photoresist, pattern light exposure, development and ion beam etching using a mask.

The electrodes 35b and 35c derived from the forward and rear ends of the multi-layered magneto-resistance effect film 35a, respectively, are used for supplying the sense current Is to the multi-layered magneto-resistance effect film 35a, and is formed of a good electrically conductive material. Similarly to the multi-layered magneto-resistance effect film 35a, these electrodes 35b, 35c are patterned to a pre-set pattern shape, using the photolithographic technique.

Figure 12:
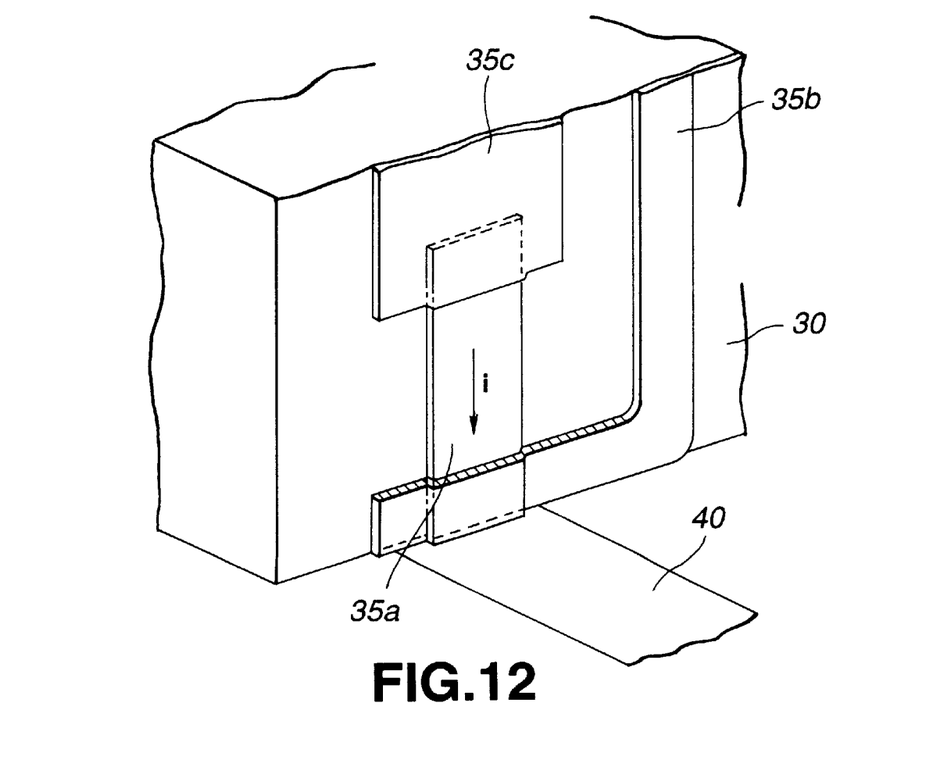
FIG. 12 is a perspective view for illustrating the mode of reproduction of a magneto-resistance effect type magnetic head.

FIG. 12 shows the manner in which information signals are reproduced from a recording medium using the above-described magneto-resistance effect type magnetic head 30. FIG. 12 schematically shows the manner of reproducing the information signals by the magneto-resistance effect type magnetic head 30. Specifically, FIG. 12 shows essential portions of the head 30 and a magnetic recording medium 40.

Referring to FIG. 7, when reproducing information signals from the recording medium 40, the surface A of the magneto-resistance effect type magnetic head 30 on which slides the recording medium 40 is caused to face a recording track of the recording medium 40. The constant sense current Is is supplied to the multi-layered magneto-resistance effect film 35a from the electrodes 35b, 35c for detecting voltage changes across the electrodes 35b and 35c at this time.

That is, with the present magneto-resistance effect type magnetic head 30, the multi-layered magneto-resistance effect film 35a is changed in resistance depending on changes in the direction of the magnetic field recorded on the recording track of the recording medium 40. The information signals from the recording medium 40 can be reproduced by detecting resistance changes in the multi-layered magneto-resistance effect film 35a in terms of voltage changes across the electrodes 35b and 35c.

The above-described magneto-resistance effect type magnetic head 30 uses the magneto-resistance effect device 20 employing the multi-layered magneto-resistance effect film 1 as described above. With this magneto-resistance effect type magnetic head 30, the magneto-resistance effect device 20 operates as the magnetically sensitive portion for detecting the signal magnetic field.

The magneto-resistance effect type magnetic head 30 uses the multi-layered magneto-resistance effect film 1 which is not affected by the sense current magnetic field and which exhibits large changes in resistance. The result is that the magneto-resistance effect type magnetic head 30 exhibits improved reproduction sensitivity when reproducing the signal magnetic field.

Although the above-described embodiment is directed to a magneto-resistance effect type magnetic head as a device exploiting the magneto-resistance effect, the multi-layered magneto-resistance effect film or magneto-resistance effect device of the present invention can be applied to devices other than the magneto-resistance effect type magnetic head. Specifically, the multi-layered magneto-resistance effect film or magneto-resistance effect device of the present invention can be applied to, for example, a magnetic sensor, such as a geomagnetic orientation sensor.

What is claimed is:

1. A multi-layered magneto-resistance effect film comprising:
   an upper magnetic layer and a lower magnetic layer; and
   a multi-layered film between said upper and lower magnetic layers, said multi-layered film comprising alternately layered magnetic layers and non-magnetic electrically conductive layers;
   wherein,
   each of said upper and lower magnetic layers has a resistivity larger than that of said magnetic layers of said multi-layered film, said magnetic layers of said multi-layered film are anti-ferromagnetically coupled to one another, said magnetic layers of said multi-layered film have alternating directions of magnetization in the absence of an external magnetic field, said upper and lower magnetic layers between which the multi-layered film is positioned extend out to an end face of the magneto-resistance effect film, said upper and lower magnetic layers are electrically conductive and are formed of a magnetic material, and said magnetic material of said upper and lower magnetic layers is a Ni—Fe alloy including at least one selected from the group consisting of Ti, Cr and Cu.

2. The multi-layered magneto-resistance effect film as claimed in claim 1 wherein said non-magnetic electrically conductive layer contains at least one selected from the group consisting of Cu, Ag, Au, Cu alloys, Ag alloys and Au alloys.

3. A magneto-resistance effect device comprising:

an upper magnetic layer and a lower magnetic layer;

a multi-layered film between the upper and lower magnetic layers, said multi-layered film comprising alternately layered magnetic layers and non-magnetic electrically conductive layers; and a pair of electrodes, one of said electrodes coupled to one end of said multi-layered magneto-resistance effect film, the other of said electrodes coupled to the other end of said multi-layered magneto-resistance effect film so that a sense current can be directed from the one electrode to the other electrode via the multi-layered magneto resistance effect film;

wherein, each of said upper and lower magnetic layers has a resistivity larger than that of said magnetic layers of said multi-layered film, said magnetic layers of said multi-layered film are anti-ferromagnetically coupled to one another, said magnetic layers of said multi-layered film have alternating directions of magnetization in the absence of an external magnetic field, said upper and lower magnetic layers between which the multi-layered film is positioned extend out to an end face of the magneto-resistance effect film, said upper and lower magnetic layers are electrically conductive and are formed of a magnetic material, and said magnetic material of said upper and lower magnetic layers is a Ni—Fe alloy including at least one selected from the group consisting of Ti, Cr and Cu.

4. The magneto-resistance effect device as claimed in claim 3 wherein said non-magnetic electrically conductive layer contains at least one selected from the group consisting of Cu, Ag, Au, Cu alloys, Ag alloys and Au alloys.

5. A magneto-resistance effect type magnetic head comprising:

an upper magnetic layer and a lower magnetic layer;

a multi-layered film between the upper and lower magnetic layers, said multi-layered film and comprising alternately layered magnetic layers and non-magnetic electrically conductive layers; and a pair of electrodes, one of said electrodes coupled to one end of said multi-layered magneto-resistance effect film, the other of said electrodes coupled to the other end of said multi-layered magneto-resistance effect film so that a sense current can be directed from the one electrode to the other electrode via the multi-layered magneto resistance effect film;

wherein, each of said upper and lower magnetic layers has a resistivity larger than that of said magnetic layers of said multi-layered film, said magnetic layers of said multi-layered film are anti-ferromagnetically coupled to one another, said magnetic layers of said multi-layered film have alternating directions of magnetization in the absence of an external magnetic field, said upper and lower magnetic layers between which the multi-layered film is positioned extend out to an end face of the magneto-resistance effect film, a signal in the form of a magnetic field on a magnetic recording medium is detected by said magneto-resistance effect device, said upper and lower magnetic layers are electrically conductive and are formed of a magnetic material, and said magnetic material of said upper and lower magnetic layers is a Ni—Fe alloy including at least one selected from the group consisting of Ti, Cr and Cu.

6. The magneto-resistance effect type magnetic head as claimed in claim 5 wherein said non-magnetic electrically conductive layers contain at least one selected from the group consisting of Cu, Ag, Au, Cu alloys, Ag alloys and Au alloys.

* * * * *